United States Patent [19]
Camilletti et al.

[11] Patent Number: 5,776,235
[45] Date of Patent: Jul. 7, 1998

[54] THICK OPAQUE CERAMIC COATINGS

[75] Inventors: Robert Charles Camilletti; Loren Andrew Haluska; Keith Winton Michael, all of Midland, Mich.

[73] Assignee: Dow Corning Corporation, Midland, Mich.

[21] Appl. No.: 725,790

[22] Filed: Oct. 4, 1996

[51] Int. Cl.⁶ .......................... C09D 183/12; B05D 3/02

[52] U.S. Cl. ................... 106/287.1; 106/287.11; 106/287.12; 106/287.13; 427/96; 427/58; 427/226; 327/603

[58] Field of Search ............... 106/287.1, 287.11, 106/287.13, 287.12; 427/58, 96, 226; 327/603

[56] References Cited

U.S. PATENT DOCUMENTS

| | | | |
|---|---|---|---|
| 3,615,272 | 10/1971 | Collins | 23/366 |
| 3,986,997 | 10/1976 | Clark | 260/29.2 |
| 4,340,619 | 7/1982 | Gaul | 427/228 |
| 4,435,219 | 3/1984 | Greigger | 106/287.12 |
| 4,500,669 | 2/1985 | Ashlock et al. | 106/287.12 |
| 4,540,803 | 9/1985 | Cannady | 556/412 |
| 4,571,365 | 2/1986 | Ashlock et al. | 106/287.12 |
| 4,680,232 | 7/1987 | Factor et al. | 106/287.12 |
| 4,689,085 | 8/1987 | Plueddemann | 106/287 |
| 4,724,004 | 2/1988 | Saito | 106/287.12 |
| 4,756,977 | 7/1988 | Haluska | 428/704 |
| 4,999,397 | 3/1991 | Weiss | 524/755 |
| 5,010,159 | 4/1991 | Bank | 528/23 |
| 5,011,706 | 4/1991 | Tarhay | 427/39 |
| 5,063,267 | 11/1991 | Hanneman | 524/284 |
| 5,169,908 | 12/1992 | Zank | 525/474 |
| 5,387,480 | 2/1995 | Haluska et al. | 428/698 |
| 5,399,441 | 3/1995 | Bearinger | 428/689 |
| 5,416,190 | 5/1995 | Mine | 528/492 |
| 5,436,083 | 7/1995 | Haluska et al. | 428/688 |
| 5,436,084 | 7/1995 | Haluska | 428/688 |
| 5,458,912 | 10/1995 | Camilletti et al. | 427/126.4 |
| 5,492,958 | 2/1996 | Haluska et al. | 524/439 |
| 5,516,596 | 5/1996 | Camilletti et al. | 428/698 |
| 5,541,248 | 7/1996 | Haluska et al. | 524/420 |
| 5,635,249 | 6/1997 | Haluska et al. | 427/387 |

FOREIGN PATENT DOCUMENTS

| | | |
|---|---|---|
| 86017 | 5/1985 | Japan . |
| 107122 | 5/1988 | Japan . |
| 178749 | 7/1990 | Japan . |

*Primary Examiner*—David Brunsman
*Attorney, Agent, or Firm*—Sharon K. Severance; James L. DeCesare

[57] ABSTRACT

Thick opaque ceramic coatings are used to protect delicate microelectronic devices against excited energy sources, radiation, light, abrasion, and wet etching techniques. The thick opaque ceramic coating are prepared from a mixture containing phosphoric anhydride, i.e., phosphorous pentoxide ($P_2O_5$), and a pre-ceramic silicon-containing material. It is preferred to also include tungsten carbide (WC) and tungsten metal (W) in the coating mixture. The coating is pyrolyzed to form a ceramic $SiO_2$ containing coating. A second coating of plasma enhanced chemical vapor deposited (PECVD) silicon carbide (SiC), diamond, or silicon nitride ($Si_3N_4$), can be applied over the thick opaque ceramic coating to provide hermeticity. These coatings are useful on patterned wafers, electronic devices, and electronic substrates. The thick opaque ceramic coating is unique because it is resistant to etching using wet chemicals, i.e., acids such as $H_3PO_4$ and $H_2SO_4$, or bases.

15 Claims, No Drawings

THICK OPAQUE CERAMIC COATINGS

BACKGROUND OF THE INVENTION

This invention is directed to a method of forming coatings using compositions preferably containing a methyl silsesquioxane resin, colloidal silica, and certain other opaque materials and/or obstructing agents. These protective coatings are useful on a variety of substrates, but especially electronic substrates.

The use of hydrogen silsesquioxane resin $(HSiO_{3/2})_n$ derived ceramic coatings on substrates such as electronic devices is known. Thus, U.S. Pat. No. 4,756,977 (Jul. 12, 1988), discloses a process of forming a silica coating on an electronic substrate. According to the process, a solution of hydrogen silsesquioxane resin is applied to a substrate, followed by heating the coated substrate in air at a temperature in the range of 200°–1,000° C. The '977 patent, however, does not teach the use of opaque materials or obstructing agents within the coating, nor is the $(HSiO_{3/2})_n$ resin derived ceramic coatings on the substrate taught to be resistant to wet etching techniques.

The use of silica within a protective coating is known. Thus, U.S. Pat. No. 3,986,997 (Oct. 19, 1976), describes a coating composition containing an acidic dispersion of colloidal silica, and partial condensate of methylsilanetriol in an alcohol-water medium. The coating composition can be used to apply transparent abrasion resistant coatings on a variety of substrates. The '997 patent, however, does not describe the use of tungsten carbide, tungsten metal, or phosphoric anhydride, as an opaque material or obstructing agent; it does not describe applying the coating on an electronic substrate for the purpose of providing resistance to wet etching; nor does it describe pyrolysis of the coating at the high temperatures (i.e., 400°to 1,000° C.) as contemplated herein.

Accordingly, what we have discovered is that useful coatings can be formed from compositions containing phosphoric anhydride, a pre-ceramic silicon-containing material, and certain other additional opaque materials or obstructing agents; and that these coatings provide protection and resistance against various intrusion techniques, especially wet etching.

BRIEF SUMMARY OF THE INVENTION

Our invention relates to a method of forming a coating on a substrate and to substrates coated thereby. The method comprises applying a coating composition containing an opaque material or obstructing agent and a pre-ceramic silicon-containing material on the substrate. The coated substrate is then heated at a temperature sufficient to convert (pyrolyze) the coating composition to a ceramic coating. The method is especially valuable for forming protective coatings on a variety of electronic devices.

Our invention also relates to the coating composition containing an opaque material or obstructing agent and a pre-ceramic silicon-containing material.

While methods and compositions described herein are preferably prepared using a resin derived from an aqueous alkanol dispersion of colloidal silica and partial condensate of methylsilanetriol, other preceramic silicon-containing materials can be employed, such as:

(i) a hydrogen silsesquioxane resin,
(ii) a hydrolyzed or partially hydrolyzed compound of the formula $R_nSi(OR)_{4-n}$ in which R is independently an aliphatic, alicyclic, or aromatic substituent of 1–20 carbon atoms, and n is 0–3,
(iii) a hydridopolysilazane resin,
(iv) a methyl polydisilylazane resin, or
(v) a boron modified hydropolysilazane.

These and other features and objects of our invention will become apparent from a consideration of the detailed description.

DETAILED DESCRIPTION

Our invention is concerned with preparation of a thick opaque protective ceramic coating that is effective against various forms of energy, and which contains a solid reactive material that is a deterrent for preventing examination of an integrated circuit. The coating is effective against ozone, UV-ozone, gaseous free radicals and ions, any vapor or liquid borne reactive species, or plasmas. In addition, the coating is resistant to abrasion and is opaque to radiation and light.

The coating preferably contains a combination of colloidal silica and partial condensate of methylsilanetriol, which is more resistant to being wet chemical etched with either an acid or a base, because it presents a surface that is more hydrophobic than a hydrogen silsesquioxane resin. This enhances the tamper-proof qualities of the coating. The coating also contains solid $P_2O_5$ which obstructs and acts as a deterrent to any attack by wet etching techniques. It functions in this capacity by generating phosphoric acid that would readily destroy the integrated circuit and its memory.

In the most preferred embodiment, the coating is prepared from a combination of colloidal silica and partial condensate of methylsilanetriol, tungsten carbide (WC), tungsten metal (W) and solid $P_2O_5$. These components of the coating composition provide protection for any microelectronic device, and are useful for application on gallium arsenide (GaAs), silicon, metallic, or other electronic substrates, devices, or patterned wafers. If desired, a second hermetic coating, such as PECVD silicon carbide, diamond, or silicon nitride, can be applied to provide hermeticity.

As used herein, the expression "ceramic coating" is intended to describe a hard coating obtained after heating or pyrolyzing the coating composition. The ceramic coating may contain both amorphous silica ($SiO_2$) materials, as well as amorphous silica-like materials that are not fully free of residual carbon and silanol ($\equiv$SiOH), which are obtained upon heating the coating composition.

The expression "electronic device" is meant to include electronic substrates or electronic circuits such as silicon-based devices, gallium arsenide based devices, focal plane arrays, opto-electronic devices, photovoltaic cells, and optical devices.

In our process, a ceramic coating is formed on a substrate by applying a coating composition base containing a pre-ceramic silicon-containing material onto the substrate, and then heating and pyrolyzing the coated substrate at a temperature sufficient to convert the pre-ceramic silicon-containing material to a ceramic $SiO_2$ containing coating.

One suitable coating composition base and method for its preparation is described in U.S. Pat. No. 3,986,997 (Oct. 19, 1976), incorporated herein by reference. This coating composition is a dispersion containing colloidal silica and a partial condensate of methylsilanetriol.

The silica component of the coating composition is present as an aqueous colloidal silica dispersion having a particle diameter of 5–150 millimicrons (nanometers). The partial condensate component of the coating composition is predominately derived from methylsilanetriol, but may contain other silanols of the formula $RSi(OH)_3$ in which R is an alkyl radical of 2 or 3 carbon atoms, the vinyl radical $CH_2=CH-$, the 3,3, 3-trifluoropropyl radical $CF_3CH_2CH_2-$, the 3-glycidoxypropyl radical, or the 3-methacryloxypropyl radical $CH_2=C(CH_3)COOCH_2CH_2CH_2-$. At least 70 weight percent of the silanol is $CH_3Si(OH)_3$.

Preferably, the coating composition contains 10-50 weight percent solids, with the distribution being 10-70 weight percent colloidal silica and 30-90 weight percent of the partial condensate of the silanol. The partial condensate of the silanol is carried in a lower aliphatic alcohol-water solvent, i.e., methanol, ethanol, isopropanol, n-butyl alcohol, or mixtures thereof.

The coating composition is prepared by adding a trialkoxysilane $RSi(OCH_3)_3$ to a colloidal silica hydrosol, and adjusting the pH to 3–6 with an organic acid such as acetic acid. Trisilanols are generated in situ by adding the trialkoxysilane to the acidic aqueous dispersion of colloidal silica. Upon generation of the silanol in the acidic aqueous medium, there occurs a partial condensation of hydroxyl substituents to form $\equiv Si-O-Si\equiv$ bonding. Alcohol is also generated by hydrolysis of the alkoxy substituents of the silane. Depending upon the percent solids desired, additional alcohol, water, or water-miscible solvent can be added, to adjust the level of solids in the coating composition. This coating composition is a clear or slightly hazy low viscosity fluid which is stable for several days, but condensation of $\equiv SiOH$ will continue at a very slow rate, and the coating composition eventually forms a gel structure.

If desired, the coating composition according to our invention may contain other ceramic oxide precursors, examples of which are compounds of various metals such as aluminum, titanium, zirconium, tantalum, niobium, or vanadium; and non-metallic compounds such as boron or phosphorous; any of which may be dissolved in solution, hydrolyzed, and subsequently pyrolyzed to form ceramic oxide coatings.

These ceramic oxide precursor compounds generally have one or more hydrolyzable groups bonded to the metal or non-metal depending on the valence of the metal. The number of hydrolyzable groups included in such compounds is not critical provided the compound is soluble in the solvent. Likewise, selection of an exact hydrolyzable substituent is not critical since it will be either hydrolyzed or pyrolyzed out of the system. Typical hydrolyzable substituents include alkoxy groups such as methoxy, propoxy, butoxy and hexoxy; acyloxy groups such as acetoxy; and other organic groups bonded to the metal or non-metal through an oxygen atom such as acetylacetonate. Some specific compounds that can be used are zirconium tetracetylacetonate, titanium dibutoxy diacetylacetonate, aluminum triacetylacetonate, and tetraisobutoxy titanium.

When the coating composition is combined with one of these ceramic oxide precursors, generally it is used in an amount such that the final ceramic coating contains 0.1-30 percent by weight of the modifying ceramic oxide precursor.

Our coating composition may contain a platinum, rhodium, or copper catalyst, to increase the rate and extent of conversion of the precursors to silica. Generally, any platinum, rhodium, or copper compound or complex which can be solubilized is appropriate, such as platinum acetylacetonate, rhodium catalyst $RhCl_3|S(CH_2CH_2CH_2CH_3)_2]_3$, a product of Dow Corning Corporation, Midland, Mich. or cupric naphthenate. These catalysts can be added in amounts of 5 to 1,000 parts per million of platinum, rhodium, or copper, based on the weight of the methyl silsesquioxane resin.

Our coating composition may optionally contain other types of opaque materials or obstructing agents, in addition to $P_2O_5$, if desired. For purposes herein, the terms opaque material or obstructing agent are used synonymously to describe a finely divided solid phase, which is distributed within the resin and the final ceramic coating, and which tends to (i) obstruct inspection, (ii) hinder inspection, or (iii) prevent reverse engineering of the device.

Specific optional materials useful in the instant invention include, but are not limited to, optically opaque materials, radiopaque materials, luminescent materials, oxidizing materials, abrasion resistant materials, magnetic materials, and conductive materials. Various inorganic and organic types of materials can be used in a variety of morphologies, including but not limited to, powders, particles, flakes, and microballoons.

Optically opaque materials are agents that when mixed with the preceramic silicon-containing material, render the resulting coating impenetrable to visual light. Optically opaque materials include but are not limited to, oxides, nitrides and carbides of silicon, alumina, metals, and inorganic pigments. Some preferred optional optically opaque materials are plasma alumina microballoons having an average particle size of about 6 microns, silica microballoons having an average particle size of about 5–40 microns, silicon nitride $(Si_3N_4)$ powder or whiskers, tungsten metal (W), silicon carbide (SiC) powder or whiskers, aluminum nitride (AlN) powder, and black inorganic pigments such as black Ferro® F6331 having an average particle size of about 0.4 microns.

Radiopaque materials are agents that when mixed with the preceramic silicon-containing material, render the resulting coating impenetrable to radiation, such as x-rays, UV, IR, and visible light, as well as sound waves. Radiopaque materials include but are not limited to heavy metals such as lead, and insoluble salts of heavy metals such as barium, lead, silver, gold, cadmium, antimony, tin, palladium, strontium, and bismuth. The salts can include for example, carbonates, sulfates, and oxides. As noted previously, tungsten metal is the most preferred radiopaque material.

Luminescent materials are agents that when mixed with the preceramic silicon-containing material, result in a coating that will absorb energy and emit electromagnetic radiation in excess of thermal radiation. These materials are typically phosphors such as sulfides (i.e., zinc sulfide and cadmium sulfide); selenides; sulfoselenides; oxysulfides; oxygen dominate phosphors such as borates, aluminates, gallates, and silicates; and halide phosphors such as alkali metal halides, alkaline earth halides, and oxyhalides. Preferred are sulfides, and most preferred is zinc sulfide. The phosphor compound may be doped with an activator. Activators include, but are not limited to manganese, silver, and copper; and rare earth ions in the form of halides. The activator is generally present in amounts of about 0.1–10 mol percent based on the weight of the phosphor.

Abrasion resistant materials are agents that when mixed with the preceramic silicon-containing material, render the resulting coating impenetrable to removal by frictional means such as scraping. Abrasion resistant materials are exemplified by, but not limited to diamond, diamond dust, titanium nitride (TiN), tantalum carbide (TaC), tungsten carbide (WC), and fibers of graphite, KEVLAR® (a DuPont trademark for aromatic polyamide fibers), NEXTEL (a tradename of 3M Company, St. Paul, Minn. for boriamodified alumina-silica fibers), and aluminum oxide ($Al_2O_3$). As noted previously, tungsten carbide is the most preferred abrasion resistant material.

Energy resistant materials are agents that when mixed with the preceramic silicon-containing material, react with energy sources such as ozone, UV-ozone, gaseous free radicals and ions, any vapor or liquid borne reactive species, and plasmas, to effectively cause degradation of the circuit and the memory. Energy resistant materials are exemplified by, but not limited to heavy metals such as lead, tungsten, tantalum, and antimony.

Magnetic materials are agents that when mixed with the perceramic silicon-containing material, render the resulting coating magnetic (i.e., magnetized by a magnetic field having a net magnetic moment). Magnetic materials are exemplified by carbon alloy ferrites, iron carbonyl, and alloys of metals such as iron, manganese, cobalt, nickel, copper, titanium, vanadium, molybdenum, magnesium, aluminum, chromium, zirconium, lead, and zinc. Some specific agents are $Fe_2O_3$, MnZn, NiZn, and CuZn.

Conductive materials are agents that when mixed with the perceramic silicon-containing material, render the resulting coating either electrically or thermally conductive. Conductive materials are exemplified by gold, silver, copper, aluminum, nickel, zinc, chromium, cobalt, and diamond.

Other optional opaque materials or obstructing agents useful herein include synthetic and natural materials such as oxides, nitrides, borides, and carbides of various metals and non-metals such as glass, phosphorous oxynitride (PON), alumina, titanium dioxide, zinc oxide, tungsten oxide, zirconium oxide ($ZrO_2$), and ruthenium oxide ($RuO_2$); titanates such as potassium titanate and barium titanate; niobates such as lithium niobate ($LiNbO_3$) and lead niobate $Pb(NbO_3)_2$; barium sulfate; calcium carbonate; precipitated diatomite; aluminum silicate or other silicates; pigments and dyes such as crystal violet ($C_{25}H_{30}N_3Cl$) and the cyanines; phosphors; metals such as silver, aluminum, or copper; wollastonite ($CaSiO_3$); mica; kaolin; clay; talc; organic materials such as cellulose, polyimides, phenol resins, epoxies, polybenzocyclobutanes; fluorocarbon polymers such as polytetrafluoroethylene $(C_2F_4)_n$, vinylidene fluoride $H_2C=CF_2$ and hexafluoropropylene $CF_3CF:CF_2$; high dielectric constant materials such as titanate, niobate, or tungstate salts of metals such as strontium, zirconium, barium, lead, lanthanium, iron, zinc, and magnesium, i.e., barium titanate ($BaTiO_3$), potassium titanate ($K_2TiO_3$), lead niobate, lithium titanate, strontium titanate, barium strontium titanate, lead lanthanium zirconium titanate, lead zirconium titanate, and lead tungstate.

The type of optional opaque material or obstructing agent employed will depend on the intended use of the coating. Thus, if the coating is to be used as an interlayer dielectric, a material such as alumina is desirable, so that the coating will have a low dielectric constant (DK). If a coating having a high DK is desired, a material such as barium titanate or lead niobate should be employed. If a conductive coating is desired, other types of metals can be added.

The particle size and shape of the opaque material or obstructing agent can vary over a wide range, depending on factors such as type of material and desired thickness of the coating. Our coatings are preferably less than about 500 microns in thickness, so a particle size of about 100 to less than about 500 microns is generally sufficient. A smaller particle size can be used, such as 50–100 microns, or even particle size from submicron (i.e., 5–150 millimicrons) to 10 microns.

The amount of opaque material or obstructing agent can be varied, depending on quality and electrical characteristics desired in the final coating. Generally, the opaque material or obstructing agent is used in amounts of from one weight percent to less than about 94 weight percent, based on the weight of pre-ceramic silicon-containing material. Sufficient resin must be employed to insure that enough resin is present to bind the opaque material or obstructing agent. Lesser amounts of opaque material or obstructing agent can also be employed, i.e., 1–5 weight percent.

If desired, the coating composition can contain a silane coupling agent to modify the surface of the opaque material or obstructing agent for better adhesion. Generally, silane coupling agents conform to the formula $A_{(4-n)}SiY_n$ where A is a monovalent organic radical such as an alkyl group, an aryl group, or a functional group such as methacryl, methacryloxy, epoxy, vinyl, or allyl; Y is a hydrolyzable radical such as an alkoxy group with 1–6 carbon atoms, an alkoxyalkoxy group with 2–8 carbon atoms, or an acetoxy group; and n is 1, 2, or 3, preferably 3.

Some examples of suitable silane coupling agents are 3-methacryloxypropyltrimethoxysilane of the formula $CH_2=C(CH_3)COO(CH_2)_3Si(OCH_3)_3$; 3-glycidoxypropyltrimethoxysilane; 3-mercaptopropyltrimethoxysilane of the formula $HSCH_2CH_2CH_2Si(OCH_3)_3$; vinyltriacetoxysilane of the formula $CH_2=CHSi(OOCCH_3)_3$; vinyltriethoxysilane of the formula $CH_2=CHSi(OC_2H_5)_3$; vinyl-tris(2-methoxyethoxy)silane of the formula $CH_2=CHSi(OCH_2CH_2OCH_3)_3$; and 2-(3,4-epoxycyclohexyl)ethyltrimethoxysilane. Reference may be had to U.S. Pat. No. 4,689,085 (Aug. 25, 1987) for these and other suitable silane coupling agents that are appropriate.

According to our process, the coating composition is applied to the surface of a substrate such as an electronic device. Various facilitating measures such as stirring and heating may be used to dissolve or disperse the opaque material or obstructing agent in the base coating composition, and create a more uniform coating solution. For example, the coating solution can be prepared by mixing the resin, opaque material or obstructing agent, solvent, and silane coupling agent, with a homogenizer, sonic probe, or colloid mill, to obtain a coating solution suitable for application to the surface of an electronic device.

Solvents which may be used include any agent or mixture of agents which will dissolve or disperse the resin and opaque material, to form a homogenous liquid mixture without affecting the resultant coating. These solvents can include, for example, alcohols such as ethyl alcohol, isopropyl alcohol, and n-butanol; ketones; esters; and glycol ethers. The solvent should be present in an amount sufficient to dissolve or disperse the materials to the concentration desired for the application. Generally, enough solvent is used to form a 0.1–80 weight percent mixture, but preferably a 1–50 weight percent mixture.

The coating mixture is then coated onto the substrate. The coating composition can be applied by spin coating, dip coating, spray coating, or flow coating. Any other equivalent coating method can also be employed such as by applying the coating composition on a substrate or device by silk screening, screen printing, meniscus coating, or wave solder coating.

The solvent is allowed to evaporate from the coated substrate resulting in deposition of the resin and opaque material containing coating composition. Any means of evaporation may be used such as air drying by exposure to an ambient environment, or by application of vacuum or mild heat (i.e., less than 50° C.) during early stages of the heat treatment. When spin coating is used, any additional drying period is minimized as spinning drives off the solvent to some extent.

Following removal of solvent, the resin and opaque material containing coating composition is converted to a ceramic coating by pyrolysis, i.e., heating it to a sufficient temperature to ceramify. Generally, this temperature is in the range of about 400° C. to about 1,000° C. depending on the pyrolysis atmosphere. Preferred temperatures are in the range of 400° C. to 800° C. Heating is conducted for a time sufficient to ceramify the coating composition. Generally, heating will require one to 6 hours, but typically less than about 3 hours will be adequate.

Heating to ceramify the coating composition may be conducted at atmospheric pressures varying from vacuum to superatmospheric, and under an oxidizing or non-oxidizing gaseous environment such as air, oxygen, an inert gas such as nitrogen, ammonia, an amine, moisture, or nitrous oxide. Heating can be carried out using a convection oven, a rapid thermal process, a hot plate, radiant energy, or microwave energy. The rate of heating is not critical although it is practical to heat the coating composition as rapidly as possible.

Pyrolysis results in removal of organic substituents and their replacement by oxygen. By this method, a ceramic coating is produced on the substrate, generally according to the scenario:

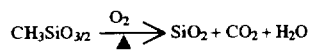
$$CH_3SiO_{3/2} \xrightarrow[\Delta]{O_2} SiO_2 + CO_2 + H_2O$$

The thickness of the ceramic coating can vary over a wide range, but is typically from 1–500 microns. These ceramic coatings are able to smooth irregular surfaces of various substrates. The coatings are (i) relatively defect free, (ii) have excellent adhesive properties, and (iii) have a variety of electrical properties, i.e., DK's less than four and up to conductive coatings. As such, such coatings are particularly useful for electronic applications such as dielectric layers, protective layers, and conductive layers.

If desired, additional coatings may be applied over the ceramic coating. These additional coatings include $SiO_2$ coatings, $SiO_2$/ceramic oxide layers, silicon-containing coatings, silicon carbon containing coatings, silicon nitrogen containing coatings, silicon oxygen nitrogen containing coatings, silicon nitrogen carbon containing coatings, and diamond-like carbon coatings. Methods for applying such coatings are described in U.S. Pat. No. 4,756,977, referred to previously. An especially preferred additional coating is silicon carbide.

The method of applying an additional coating such as silicon carbide is not critical, and such coatings can be applied by any chemical vapor deposition technique such as thermal chemical vapor deposition (TCVD), photochemical vapor deposition, plasma enhanced chemical vapor deposition (PECVD), electron cyclotron resonance (ECR), and jet vapor deposition. It could also be applied by physical vapor deposition techniques such as sputtering or electron beam evaporation. These processes involve either the addition of energy in the form of heat or plasma to a vaporized species to cause the desired reaction, or they focus energy on a solid sample of the material to cause its deposition.

For example, in thermal chemical vapor deposition, the coating is deposited by passing a stream of the desired precursor gas over a heated substrate. When the precursor gas contacts the hot surface, it reacts and deposits the coating. Substrate temperatures in the range of 25° C. to 1,000° C. are sufficient to form these coatings in several minutes to several hours, depending on the precursor gas and the thickness of the coating. Reactive metals can be used in such a process to facilitate deposition.

In PECVD techniques, a precursor gas is reacted by passing it through a plasma field. Reactive species are formed and focused at the substrate where they readily adhere. The advantage of a PECVD process over a thermal CVD process is that in the former, lower substrate and processing temperatures can be used, i.e., 25°–600° C.

Plasma used in a PECVD process can be energy derived from electric discharges, electromagnetic fields in the radio-frequency or microwave range, lasers, or particle beams. In most plasma deposition processes, it is preferred to use radio frequency (i.e., 10 kHz to $10^2$ MHz) or microwave energy (i.e., 0.1–10 GHz or $10^9$ hertz) at moderate power densities (i.e., 0.1–5 watts/cm$^2$). The frequency, power, and pressure are tailored to the precursor gas and equipment being used.

Some precursor gases that can be used include (1) mixtures of silanes or halosilanes such as trichlorosilane ($HSiCl_3$) in the presence of an alkane of 1–6 carbon atoms such as methane, ethane, and propane; (2) an alkylsilane such as methylsilane ($CH_3SiH_3$), dimethylsilane ($CH_3$)$_2SiH_2$, trimethylsilane ($CH_3$)$_3SiH$, and hexamethyldisilane ($CH_3$)$_3Si$—$Si(CH_3)_3$; or (3) a silacyclobutane or a disilacyclobutane of the type described in U.S. Pat. No. 5,011,706 (Apr. 30, 1991) incorporated by reference.

Examples of such silacyclobutanes (1) and disilacyclobutanes (2) are shown below. R1 is hydrogen, fluorine, or a hydrocarbon radical having 1–4 carbon atoms. R2 is hydrogen or a hydrocarbon radical having 1–4 carbon atoms. A preferred disilacyclobutane is 1,3-dimethyl-1,3-disilacyclobutane shown in formula (3).

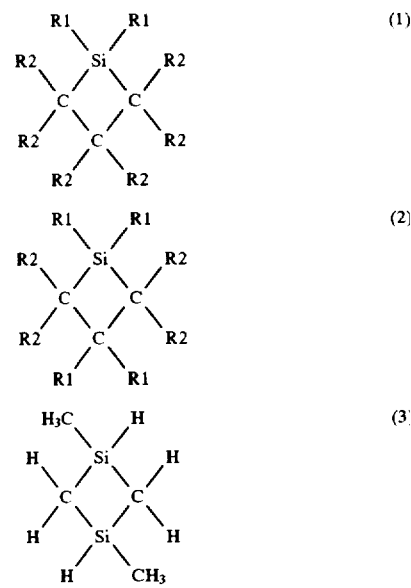

When silicon carbide is used as a coating layer, it is capable of forming a hermetic and electrical barrier over the surface of the silica-containing ceramic layer on the electronic device, and inhibits damage from chemical and mechanical means.

In a preferred coating composition according to our invention, the matrix resin is colloidal silica and partial condensate of methylsilanetriol. Opaque material or obstructing agents for the coating composition are tungsten carbide, tungsten, and $P_2O_5$. Tungsten metal is the material that functions as an energy barrier. Tungsten metal and tungsten carbide are each effective against radiation and light. Tungsten carbide has a MoHs' hardness rating greater than 9.5, and tungsten metal has a MoHs' hardness of about 6.5–7.5. Tungsten carbide is therefore the more effective against abrasion, although each are included in the coating composition and function to provide abrasion resistance.

MoHs' hardness, it is noted, is a comparison test involving the assignment of a relative number to known materials based on their ability to scratch one another. Some examples of the MoHs' hardness scale which ranks materials from 1–10, are graphite with a MoHs' hardness of 1, manganese with a MoHs' hardness of 5, quartz with a MoHs' hardness of 7, and diamond with a MoHs' hardness of 10.

As noted previously, $P_2O_5$ protects the integrated circuit and its memory from invasion by wet etching techniques, and the silane coupling agent can be included in the coating composition to improve adhesion of the coating to the electronic device.

Following is an example illustrating our invention in terms of the method for the preparation of a coating composition containing (WC), (W), and ($P_2O_5$).

EXAMPLE I

The materials listed below were mixed in a container for four periods of twenty seconds with a sonic probe to prepare a solution useful as a coating composition.

| Amount | Component |
|---|---|
| 1.0 g | Aqueous alkanol dispersion of colloidal silica and partial condensate of methylsilanetriol |
| 15.0 g | Tungsten Carbide (WC) 0.83 um average particle diameter |
| 3.0 g | Tungsten Metal (W) 0.6–0.9 um average particle diameter |
| 0.08 g | $P_2O_5$ powder |
| 0.4 g | 3-glycidoxypropyltrimethoxysilane |
| 1.0 g | Isopropyl alcohol |
| 20.48 g | Total |

The resin component of this coating composition was a solution prepared generally according to the procedure set forth in Example 1 of U.S. Pat. No. 3,986,997. This component contained 31 percent solids, 40 percent of which was $SiO_2$ and 60 percent partial condensate of $CH_3Si(OH)_3$. The remaining 69 percent of the resin component was a mixture containing water, acetic acid, isopropanol, and n-butanol.

A 4.5 inch square alumina panel with a thickness of 40 mils was coated with the solution using a 2 mil drawdown bar. The coated alumina panel was allowed to air dry for 50 minutes. The coating was then pyrolyzed at 400° C. for one hour in air. The coating was examined with a microscope under 1000× magnification and no cracks were observable. The thickness of the coating was 7.2 um. The coating had a pencil hardness of 6H, a Vickers hardness of 633 N/mm$^2$, and a modulus of 23.6 GPa (i.e., giga or $10^9$ Pascals).

The pencil test used to measure the hardness of the coating is a standard qualitative method of determining scratch resistance of coatings. According to the test procedure, a coated panel is placed on a firm horizontal surface. A pencil is held firmly against the coated film at a 45° angle pointing away from the technician conducting the test. It is pushed away by the technician in one-quarter inch (6.5 mm) strokes. The technician starts the process with the hardest lead pencil, i.e., 9H, and continues down the scale of pencil hardness, i.e., 6B, to the pencil that will not cut into or gouge the film. The hardest pencil that will not cut through the film to the substrate for a distance of at least one-eighth of an inch (3 mm) is recorded, using the Berol scale, i.e., Berol Corporation, Brentwood, Tenn.

6B, 5B, 4B, 3B, 2B, B, HB, FF, H, 2H, 3H, 4H, 5H, 6H, 7H, 8H, 9H
(softest) ⟶ (hardest)

The Vickers test used in our evaluation of the coating is a measure of the resistance of a material to deformation. The test procedure is described in the American Society for Testing and Materials, Philadelphia, Pa., (ASTM) Standard Number E92. According to the test procedure, a pyramidal diamond is used as an indenter. The test is conducted using a flat specimen on which the indenter is hydraulically loaded. When the prescribed number of indentations have been made, the specimen is removed, the diagonals of the indentations are measured using a calibrated microscope, and then the values are averaged. A Vickers hardness number (VHN) can be calculated, or the VHN can be taken from a precalculated table of indentation size versus Vickers Hardness Numbers. The Vickers scale for VHN ranges from a low value of 100 which is a measure of the softest, to a high value of 900 which is a measure of the hardest.

Coating compositions most suitable for use according to our invention should contain 0.05–20 percent by weight of the combination of colloidal silica and partial condensate of methylsilanetriol, 5–30 percent by weight of tungsten metal, 30–80 percent by weight of tungsten carbide, 0.1–5 percent by weight of phosphoric anhydride, and 1–5 percent by weight of a silane coupling agent; the remainder of the coating composition being the solvent(s).

The amount of tungsten carbide can be varied from 1–91 volume percent. The amount of tungsten metal can also be varied from 1–91 volume percent minus the volume percent of tungsten carbide. In addition, the amount of phosphoric anhydride can be varied from 1–30 volume percent, minus the combined volume percent of tungsten carbide and tungsten metal.

Our invention is also applicable to the formation of coatings using phosphoric anhydride in combination with coating compositions other than those containing colloidal silica and partial condensate of methylsilanetriol.

Thus, other useful preceramic silicon-containing materials include precursors to silicon oxides, especially silica. The silicon oxide precursors which may be used include, but are not limited to, hydrogen silsesquioxane resin, hydrolyzed or partially hydrolyzed $R_nSi(OR)_{4-n}$, or combinations of the above, in which each R is independently an aliphatic, alicyclic or aromatic substituent of 1–20 carbon atoms, preferably 1–4, such as an alkyl (i.e., methyl, ethyl, propyl), alkenyl (i.e., vinyl or allyl), alkynyl (i.e., ethynyl), cyclopentyl, cyclohexyl, or phenyl, and n is 0–3, preferably 0 or 1.

The hydrogen silsesquioxane resin which may be used includes hydridosiloxane resins of the formula $HSi(OH)_x(OR)_yO_{z/2}$, in which each R is independently an organic group or a substituted organic group which, when bonded to silicon through the oxygen atom, forms a hydrolyzable substituent, $x=0–2$, $y=0–2$, $z=1–3$, $x+y+z=3$. Examples of the R group include alkyls such as methyl, ethyl, propyl, and butyl, aryls such as phenyl, and alkenyls such as allyl or vinyl. These resins may be fully condensed $(HSiO_{3/2})_n$, or they may be only partially hydrolyzed (i.e., containing some ≡Si—OR) and/or partially condensed (i.e., containing some ≡Si—OH). Although not represented by this structure, these resins may also contain a small number (i.e., less than about 10%) of silicon atoms which have either 0 or 2 hydrogen atoms attached thereto or a small number of ≡SiC bonds due to various factors involved in their formation or handling.

Hydrogen silsesquioxane resins are ladder or cage polymers which can be shown generally by the formula:

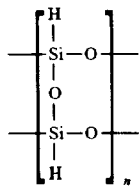

Typically, n has a value of four or more. By way of illustration, when n is four, a bond arrangement for a silsesquioxane cubical octamer is shown below:

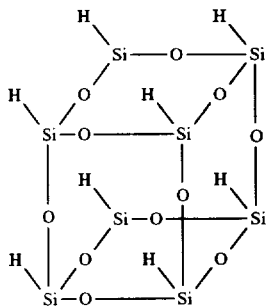

As this series is extended, i.e., n being ten or more, double-stranded polysiloxanes of indefinitely higher molecular weight are formed, containing regular and repeated cross-ties in their extended structure.

Hydrogen silsesquioxane resin and methods for their production are known in the art. For example, U.S. Pat. No. 3,615,272, which is incorporated herein by reference, teaches the production of a nearly fully condensed hydrogen silsesquioxane resin (which may contain up to 100–300 ppm silanol) by a process comprising hydrolyzing trichlorosilane in a benzenesulfonic acid hydrate hydrolysis medium, and then washing the resultant resin with water or aqueous sulfuric acid. Similarly, U.S. Pat. No. 5,010,159, which is hereby incorporated by reference, teaches an alternative method comprising hydrolyzing hydridosilanes in an arylsulfonic acid hydrate hydrolysis medium to form a resin which is then contacted with a neutralizing agent.

Other hydridosiloxane resins, such as those described in U.S. Pat. No. 4,999,397, hereby incorporated by reference, those produced by hydrolyzing an alkoxy or acyloxy silane in an acidic, alcoholic hydrolysis medium, those described in Kokai Patent Nos. 59-178749, 60-86017 and 63-107122, or any other equivalent hydridosiloxane, will also function herein.

It is to be noted that specific molecular weight fractions of the above hydrogen silsesquioxane resin may also be used in this process. Such fractions and methods for their preparation are taught by U.S. Pat. Nos. 5,063,267 and 5,416,190, which are hereby incorporated by reference. A preferred fraction comprises material wherein at least 75% of the polymeric species have a molecular weight above about 1,200, and a more preferred fraction comprises material wherein at least 75% of the polymeric species have a number average molecular weight between about 1,200 and about 100,000.

Another type of silica precursor material useful herein includes hydrolyzed or partially hydrolyzed compounds of the formula $R_nSi(OR)_{4-n}$ in which R and n are as defined above. Some of these materials are commercially available, for example, under the tradename ACCUGLASS from Allied Signal Inc., Morristown, N.J. Specific compounds of this type include methyltriethoxysilane, phenyltriethoxysilane, diethyldiethoxysilane, methyltrimethoxysilane, dimethyldimethoxysilane, phenyltrimethoxysilane, vinyltrimethoxysilane, tetramethoxysilane, tetraethoxysilane, tetrapropoxysilane, and tetrabutoxysilane After hydrolysis or partial hydrolysis of these compounds, the silicon atoms therein may be bonded to C, OH or OR groups, but a substantial portion of the material is believed to be condensed in the form of soluble ≡Si—O—Si≡ resins. Compounds in which x=2 or 3 are generally not used alone, as volatile cyclic structures are generated during pyrolysis, but small amounts of said compounds may be cohydrolyzed with other silanes to prepare useful preceramic materials.

Additional examples of other silicon-containing preceramic materials include silicon carbonitride precursors such as hydridopolysilazane resin and methylpolydisilylazane resin. Processes for the production of these materials are described in U.S. Pat. No. 4,540,803, and 4,340,619, respectively, both of which are incorporated herein by reference. Examples of silicon carbide precursors include polycarbosilanes, and examples of silicon nitride precursors include polysilazanes. Oxygen can be incorporated into the ceramics resulting from the above precursors, or the precursors can be converted to silica by pyrolyzing them in an oxygen-containing environment. Mixtures of silicon-containing preceramic materials may also be used.

Yet other silicon-containing preceramic materials include polyborosilazanes (or borosilazanes). Processes for the production of these materials are described in U.S. Pat. No. 5,169,908 (Dec. 8, 1992), and U.S. Pat. No. 5,436,084 (Jul. 25, 1995), incorporated herein by reference. An example of one particularly preferred polymer is a boron modified hydropolysilazane produced by reacting a hydrosilazane polymer with a borane complex or diborane, as explained in the '084 patent.

Following are some additional examples illustrating our invention in terms of the method for the preparation of other coating compositions containing (WC), (W), and $(P_2O_5)$.

EXAMPLE II

The materials listed below, except for $P_2O_5$, were mixed in a container for two periods of twenty seconds. $P_2O_5$ was added, and the resulting mixture was mixed for an additional period of twenty seconds with a sonic probe to prepare a solution useful as a coating composition.

| Amount | Component |
|---|---|
| 1.0 g | Hydrogen silsesquioxane resin made by the method of US Pat. No. 3,615,272 |
| 15.0 g | Tungsten Carbide (WC) 0.83 um average particle diameter |

-continued

| Amount | Component |
|---|---|
| 3.0 g | Tungsten Metal (W) 0.6–0.9 um average particle diameter |
| 0.08 g | P₂O₅ powder |
| 0.4 g | 3-glycidoxypropyltrimethoxysilane |
| 3.0 g | Xylene |
| 22.48 g | Total |

A 4.5 inch square alumina panel with a thickness of 40 mils was coated with the solution using a 2 mil drawdown bar. The coated alumina panel was allowed to air dry for 3 hours. The coating was then pyrolyzed at 400° C. for one hour in air. The coating was examined with a microscope under 1000× magnification and no cracks were observable. The thickness of the coating was 18.7 um.

EXAMPLE III

The materials listed below were mixed in a container for four periods of twenty seconds with a sonic probe to prepare a solution useful as a coating composition.

| Amount | Component |
|---|---|
| 1.104 g | Hydridopolysilazane (55.6 weight percent solids in xylene) made by the method of US Pat. No. 4,540,803 |
| 10.5 g | Tungsten Carbide (WC) 0.83 um average particle diameter |
| 3.5 g | Tungsten Metal (W) 0.6–0.9 um average particle diameter |
| 0.5 g | P₂O₅ powder |
| 0.3 g | 3 glycidoxypropyltrimethoxysilane |
| 2.5 g | Mixture of 25 percent by weight octamethylcyclotetrasiloxane and 75 percent by weight decamethylcyclopentasiloxane |
| 18.4 g | Total |

A 4.5 inch square alumina panel with a thickness of 40 mils was coated with the solution using a 2 mil drawdown bar. The coated alumina panel was allowed to air dry for 2 hours. The coating was then pyrolyzed at 400° C. for one hour in air. The coating was examined with a microscope under 1000× magnification and no cracks were observable. The thickness of the coating was 12.8 um.

EXAMPLE IV

The materials listed below were mixed in a container for four periods of twenty seconds with a sonic probe to prepare a solution useful as a coating composition.

| Amount | Component |
|---|---|
| 1.05 g | Borohydridopolysilazane (57 weight percent solids in xylene containing 1.5 weight percent B) made by the method of US Pat. No. 5,169,908 |
| 10.5 g | Tungsten Carbide (WC) 0.83 um average particle diameter |
| 3.6 g | Tungsten Metal (W) 0.6–0.9 um average particle diameter |
| 0.5 g | P₂O₅ powder |
| 0.3 g | 3-glycidoxypropyltrimethoxysilane |
| 2.5 g | Mixture of 25 percent by weight octamethylcyclotetrasiloxane and 75 percent by weight decamethylcyclopentasiloxane |
| 18.45 g | Total |

A 4.5 inch square alumina panel with a thickness of 40 mils was coated with the solution using a 2 mil drawdown bar. The coated alumina panel was allowed to air dry for 1 hour and 50 minutes. The coating was then pyrolyzed at 400° C. for one hour in air. The coating was examined with a microscope under 1000× magnification and no cracks were observable. The thickness of the coating was 31.7 um.

Other variations may be made in the compounds, compositions, and methods described herein without departing from the essential features of our invention. The forms of our invention are exemplary only and not intended as limitations on its scope which is defined in the claims.

We claim:

1. A method of forming a coating on an electronic device comprising applying to a surface of the electronic device a coating composition containing phosphoric anhydride, and a preceramic silicon-containing material selected from the group consisting of (i) a resin derived from an aqueous alkanol dispersion of colloidal silica and partial condensate of methylsilanetriol, (ii) a hydrogen silsesquioxane resin, (iii) a hydrolyzed or partially hydrolyzed compound of the formula $R_nSi(OR)_{4-n}$ in which R is independently an aliphatic, alicyclic, or aromatic substituent of 1–20 carbon atoms, and n is 0–3, (iv) a hydridopolysilazane resin, (v) a methyl polydisilylazane resin, and (vi) a boron modified hydropolysilazane, and converting the coating composition into a ceramic $SiO_2$ containing coating.

2. A method according to claim 1 in which the coating composition additionally contains tungsten or tungsten carbide.

3. A method according to claim 1 wherein the coating composition is applied to the surface of the electronic device by spray coating, dip coating, flow coating, spin coating, silk screening, screen printing, meniscus coating, or wave solder coating.

4. A method according to claim 1 wherein the coating on the surface of the electronic device is pyrolyzed at a temperature in the range of about 400° C. to about 1,000° C., to convert the coating composition into the ceramic $SiO_2$ containing coating.

5. A method according to claim 4 wherein the coated surface of the electronic device is pyrolyzed in an environment selected from the group consisting of air, oxygen, oxygen plasma, an inert gas, ammonia, an amine, moisture, and nitrous oxide.

6. A method according to claim 1 wherein the coating composition further comprises a silane coupling agent having the formula $A_{(4-n)}SiY_n$ where A is an alkyl group, an aryl group, or a functional substituent selected from the group consisting of methacryl, methacryloxy, epoxy, vinyl, or allyl; Y is a hydrolyzable radical selected from the group consisting of an alkoxy group with 1–6 carbon atoms, an alkoxyalkoxy group with 2–8 carbon atoms, or an acetoxy group; and n is 1, 2, or 3.

7. A method according to claim 6 wherein the silane coupling agent is selected from the group consisting of 3-methacryloxypropyltrimethoxysilane, 3-glycidoxypropyltrimethoxysilane, 3-mercaptopropyltrimethoxysilane, vinyltriacetoxysilane, vinyltriethoxysilane, vinyl-tris(2-methoxyethoxy)silane, and 2-(3,4-epoxycyclohexyl)ethyltrimethoxysilane.

8. A method according to claim 1 wherein a second coating of silicon carbide, diamond, or silicon nitride, is applied over the ceramic coating by plasma enhanced chemical vapor deposition.

9. An electronic device coated according to the method defined in claim 1.

10. A coating composition comprising phosphoric anhydride, and a preceramic silicon-containing material selected from the group consisting of
   (i) a resin derived from an aqueous alkanol dispersion of colloidal silica and partial condensate of methylsilanetriol,
   (ii) a hydrogen silsesquioxane resin,
   (iii) a hydrolyzed or partially hydrolyzed compound of the formula $R_nSi(OR)_{4-n}$ in which R is independently an aliphatic, alicyclic, or aromatic substituent of 1–20 carbon atoms, and n is 0–3,
   (iv) a hydridopolysilazane resin,
   (v) a methyl polydisilylazane resin, and
   (vi) a boron modified hydropolysilazane.

11. A coating composition according to claim 10 additionally containing tungsten or tungsten carbide.

12. A coating composition according to claim 10 further comprising a silane coupling agent of the formula $A_{(4-n)}SiY_n$ where A is an alkyl group, an aryl group, or a functional substituent selected from the group consisting of methacryl, methacryloxy, epoxy, vinyl, or allyl; Y is a hydrolyzable radical selected from the group consisting of an alkoxy group with 1–6 carbon atoms, an alkoxyalkoxy group with 2–8 carbon atoms, or an acetoxy group; and n is 1, 2, or 3.

13. A coating composition according to claim 12 wherein the silane coupling agent is selected from the group consisting of 3-methacryloxypropyltrimethoxysilane, 3-glycidoxypropyltrimethoxysilane, 3-mercaptopropyltrimethoxysilane, vinyltriacetoxysilane, vinyltriethoxysilane, vinyl-tris(2-methoxyethoxy)silane, and 2-(3,4-epoxycyclohexyl)ethyltrimethoxysilane.

14. A coating composition according to claim 10 further comprising a solvent selected from the group consisting of ketones, esters, and glycol ethers.

15. A method of protecting an electronic device from damage due to exposure of the device to excited energy sources, radiation, light, abrasion, and against wet etching techniques, comprising applying to a surface of the device the coating composition of claim 10.

* * * * *